(12) United States Patent
Schwan et al.

(10) Patent No.: US 7,338,872 B2
(45) Date of Patent: Mar. 4, 2008

(54) METHOD OF DEPOSITING A LAYER OF A MATERIAL ON A SUBSTRATE

(75) Inventors: Christoph Schwan, Gebhardshain (DE); Thomas Feudel, Radebeul (DE); Thorsten Kammler, Ottendorf-Okrilla (DE)

(73) Assignee: Advanced Micro Devices, Inc., Austin, TX (US)

( * ) Notice: Subject to any disclaimer, the term of this patent is extended or adjusted under 35 U.S.C. 154(b) by 342 days.

(21) Appl. No.: 11/009,825

(22) Filed: Dec. 10, 2004

(65) Prior Publication Data

US 2005/0170660 A1    Aug. 4, 2005

(30) Foreign Application Priority Data

Jan. 30, 2004    (DE) .................. 10 2004 004 846

(51) Int. Cl.
*H01L 21/336* (2006.01)
(52) U.S. Cl. .................. 438/300; 438/301; 438/303; 257/E21.626
(58) Field of Classification Search .......... 438/300, 438/301, 303
See application file for complete search history.

(56) References Cited

U.S. PATENT DOCUMENTS

| 4,839,311 A | 6/1989 | Riley et al. ................. 437/228 |
| 6,403,485 B1 * | 6/2002 | Quek et al. ................. 438/692 |
| 6,524,920 B1 | 2/2003 | Yu ............................. 438/303 |
| 2004/0129979 A1 * | 7/2004 | Park et al. .................. 257/350 |
| 2004/0232456 A1 * | 11/2004 | Hong .......................... 257/257 |

FOREIGN PATENT DOCUMENTS

| EP | 0 747 941 A2 | 12/1996 |
| EP | 1 122 771 A2 | 8/2001 |

* cited by examiner

*Primary Examiner*—Thanh Nguyen
(74) *Attorney, Agent, or Firm*—Williams, Morgan & Amerson, P.C.

(57) ABSTRACT

The present invention makes it possible to precisely deposit a material adjacent a feature on a substrate. A layer of the material is deposited on the substrate. The layer is planarized and exposed to an etchant. The etchant is adapted to selectively remove the material. The exposing of the layer to the etchant is stopped prior to a complete removal of the layer.

11 Claims, 5 Drawing Sheets

METHOD OF DEPOSITING A LAYER OF A MATERIAL ON A SUBSTRATE

BACKGROUND OF THE INVENTION

1. Field of the Invention

The present invention relates to the field of manufacturing of semiconductor devices, and, more particularly, to the deposition of layers on a substrate.

2. Description of the Related Art

Integrated circuits comprise a large number of individual circuit elements, such as transistors, capacitors, resistors and the like. These elements are connected internally to form complex circuits such as memory devices, logic devices and microprocessors. An improvement in the performance of integrated circuits requires a reduction of feature sizes. In addition to an increase in the speed of operation due to reduced signal propagation times, reduced feature sizes allow an increase in the number of functional elements in the circuit in order to extend its functionality.

Figure 1:
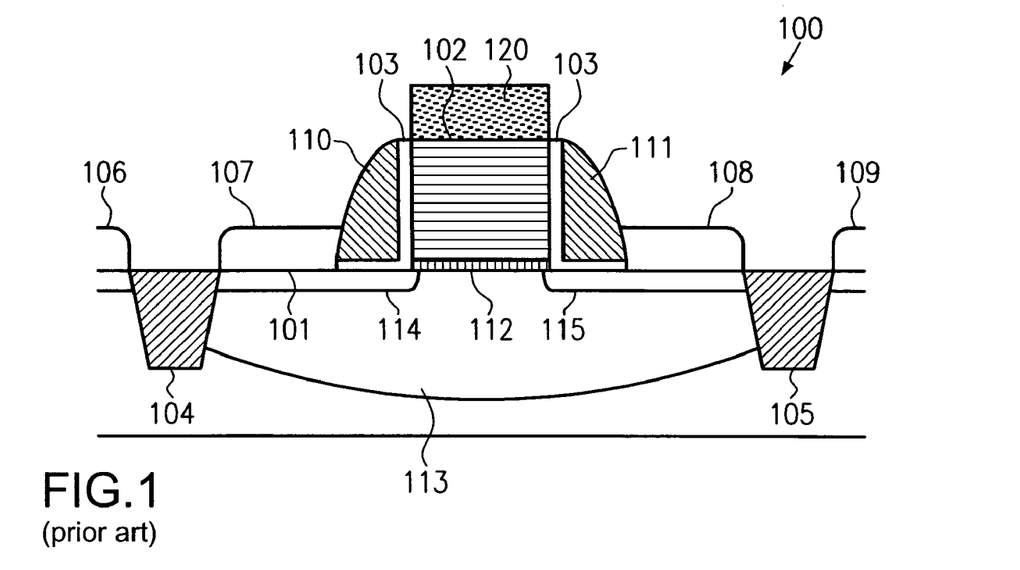
FIG. 1 shows a schematic cross-sectional view of a field effect transistor according to the state of the art.

FIG. 1 shows a schematic cross-sectional view of a field effect transistor 100 according to the state of the art. A substrate 101 comprises an active region 113. Shallow trench isolations 104, 105 isolate the active region 113 from neighboring circuit elements. An electrically conductive gate electrode 102 is formed over the substrate 101 and isolated from the substrate 101 by a gate insulation layer 112. The gate electrode 102 comprises a screening layer 103. A top surface of the gate electrode 102 is covered by a bottom antireflective coating (BARC) layer 120. The gate electrode 102 is flanked by sidewall spacers 110, 111. A raised source region 107 and a raised drain region 108 are formed on the substrate adjacent the sidewall spacers 110, 111.

Additionally, the field effect transistor 100 comprises an extended source region 114 and an extended drain region 115, which are formed in the substrate 101 below the raised source region 107 and the raised drain region 108, respectively. A portion of the extended source region 114, which is denoted as "source extension," extends below the sidewall spacer 110 and is adjacent the gate electrode 102. Similarly, a portion of the extended drain region 115, denoted as "drain extension," extends below the sidewall spacer 111 and is adjacent the gate electrode 102. Together, the raised source region 107 and the extended source region 114 form a source of the field effect transistor 100. Similarly, the raised drain region 108 and the extended drain region 115 together form a drain of the field effect transistor 100.

Due to the presence of the raised source region 107 and the raised drain region 108, the electric resistance of the field effect transistor 100 is reduced compared to a transistor without a raised source region and a raised drain region having a source region similar to the extended source region 114 and a drain region similar to the extended drain region 115.

Instead of providing the raised source region 107 and the raised drain region 108, one might alternatively reduce the resistivity of the field effect transistor 100 by providing a source region and a drain region in the substrate 101 adjacent the sidewall spacers 110, 111, and partially overlapping the extended source region 114 and the extended drain region 115. This, however, entails an enlarged area of the PN-junction between the source and drain, respectively, and the active region 113, which leads to greater signal delays due to an increase of the junction capacity. Therefore, providing the raised source region 107 and the raised drain region 108 clearly provides an advantage in high performance applications.

A method of forming a field effect transistor comprising a raised source region and a raised drain region will be described with reference to FIG. 1. First, the trench isolations 104, 105 and the active region 113 are formed in the substrate 101. Then, the gate insulation layer 112, the gate electrode 102 and the BARC layer 120 are formed over the substrate 101. These structures are formed using advanced techniques of ion implantation, deposition, oxidation and photolithography. Subsequently, the extended source region 114 and the extended drain region 115 are formed. This can be done by implanting ions of a dopant in the substrate 101. Parts of the substrate outside the transistor 100 that are not to be doped are covered by a layer of photoresist (not shown) that absorbs ions. Following implantation, the screening layer 103 and the sidewall spacers 110, 111 are formed adjacent the gate electrode 102 using deposition and anisotropic etching techniques. In particular, the sidewall spacers 110, 111 may be formed by means of known techniques comprising conformally depositing a layer of a sidewall spacer material and then performing an anisotropic etching process adapted to selectively remove the sidewall spacer material. Due to the anisotropy of the etching process, the sidewall spacers are left adjacent the gate electrode 102. Subsequently, a selective epitaxial growth process is performed to form the raised source region 107 and the raised drain region 108.

Selective epitaxial growth is a variant of chemical vapor deposition wherein process parameters such as temperature, pressure, and composition of the reactant gas are adapted such that a layer of material is deposited only in the exposed portions of the substrate 101, whereas there is no deposition on the trench isolations 104, 105, the BARC layer 120 and the sidewall spacers 110, 111. In particular, a layer of material is deposited in an area between the trench isolation 104 and the sidewall spacer 110 to form the raised source region 107. Additionally, a layer of material is deposited in an area between the sidewall spacer 111 and the trench isolation 105 to form the raised drain region 108. Additional layers 106, 109 may be formed in other regions where the substrate 101 is exposed.

In a particular example of a prior art process, the substrate comprises silicon. The screening layer 103, the BARC layer 120, the trench isolations 104, 105, and the sidewall spacers 110, 111 comprise a dielectric material, e.g., silicon dioxide and/or silicon nitride. In selective epitaxial growth, silane ($SiCl_4$) and hydrogen ($H_2$) are used as reactants. At growth temperature, these reactants react to silicon and hydrochloric acid. The reaction can proceed in both directions. The etching created in the back-reaction is important as it relates to inhibition of silicon growth on the areas covered by the dielectric.

After the formation of the source region 107 and the drain region 108, these regions are doped by means of implantation of ions of a dopant material.

Finally, an annealing may be performed to activate dopants in the active region 113, the extended source region 114, the extended drain region 115, the raised source region 107 and the raised drain region 108.

A problem of the prior art method of forming a field effect transistor comprising a raised source region and a raised drain region is that selective epitaxial growth is performed in ranges of process parameters where the deposited material grows epitaxially, adopting the crystal structure of the underlying substrate. Due to the crystalline structure, however, channeling effects may occur in the implantation of ions which may adversely affect the doping process.

Another problem of the prior art method of forming a field effect transistor comprising a raised source region and a raised drain region is that, in selective epitaxial growth, aggressive chemical compounds such as hydrochloric acid are generated. These compounds may damage the chemical vapor deposition apparatus and corrode components such as, e.g., vacuum pumps, unless elaborate countermeasures are performed.

Yet another problem of the prior art method of forming a field effect transistor comprising a raised source region and a raised drain region is that selective epitaxial growth is still not completely optimized and manufacturing proven.

In view of the above-mentioned problems, a need exists for techniques which allow the formation of a field effect transistor comprising a raised source region and a raised drain region and which are more compatible with existing processes used in the formation of integrated circuits.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment of the present invention, a method comprises providing a substrate comprising a feature. A layer of a material is deposited over the substrate and the feature. The layer of material is planarized and exposed to an etchant, the etchant being adapted to selectively remove the layer of material. The exposure of the layer of material to the etchant is stopped prior to a complete removal of the layer.

According to another illustrative embodiment of the present invention, a method comprises providing a substrate comprising a feature. At least one spacer comprising a spacer material is formed adjacent the feature. The at least one spacer has an angled shape. A first shank of the spacer is substantially parallel to a surface of the substrate. A second shank of the spacer is substantially parallel to a side surface of the feature. A layer of a material is deposited over the substrate and the feature. The layer of material is planarized and exposed to an etchant, the etchant being adapted to selectively remove the layer of material. It is detected when the etching process exposes the first shank and the exposure of the layer of material to the etchant is stopped upon detecting the exposure of the first shank.

According to yet another illustrative embodiment of the present invention, a method comprises providing a substrate comprising a feature. A layer of a material is deposited over the substrate and the feature. The layer of material comprises a sub-layer additionally comprising an etch indicator material. The layer of material is planarized and exposed to an etchant, the etchant being adapted to selectively remove the layer of material. An emission intensity representative of a chemical reaction between the etch indicator material and the etchant is measured, and the exposure of the layer of material to the etchant is stopped upon a detection of an alteration of the emission intensity.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention makes it possible to precisely deposit a material adjacent a feature on a substrate without requiring the application of selective epitaxial growth. In embodiments of the present invention, a layer of the material is deposited on the substrate. The layer is planarized to obtain a flat surface that is substantially parallel to a surface of the substrate. Subsequently, the layer is exposed to an etchant. The etchant is adapted to selectively remove the deposited material, whereas a material of the feature is not etched at all or etched at a significantly lower etching rate. In the etching process, the surface of the layer advances towards the surface of the substrate. Since the etching rate is substantially equal over the entire surface, the surface of the layer remains substantially parallel to the surface of the substrate in this process.

Due to the selectivity of the etchant, the feature is successively exposed in this process. The etching process is stopped prior to a complete removal of the deposited layer such that a portion of the material remains on the surface of the substrate adjacent the feature.

Figure 2A:
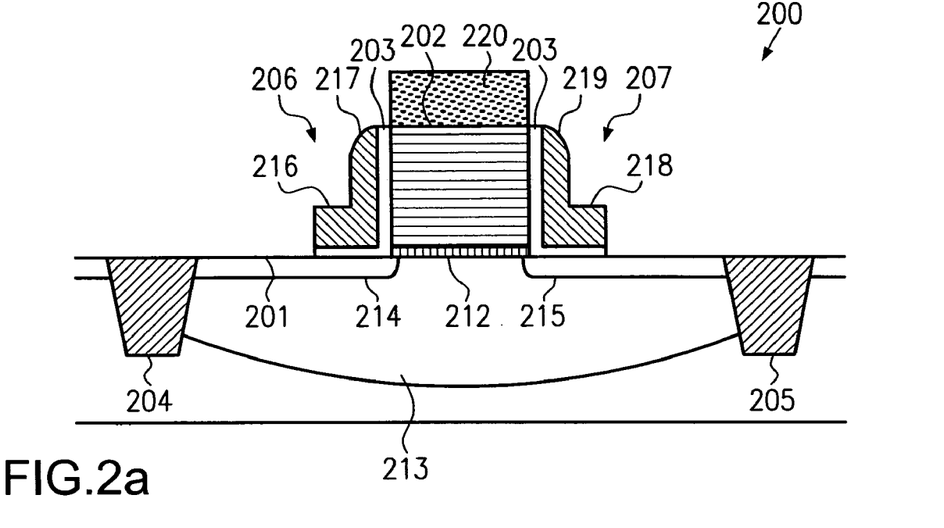
FIGS. 2a-2d show schematic cross-sectional views of a field effect transistor in stages of a manufacturing process according to an embodiment of the present invention.

An illustrative embodiment of the present invention is described with reference to FIGS. 2a-2d. FIG. 2a shows a schematic cross-sectional view of a field effect transistor 200 in a first stage of the manufacturing process. In a substrate 201, an active region 213 and trench isolations 204, 205 are formed. A gate insulation layer 212 and a gate electrode 202 covered with a BARC layer 220 are formed over the substrate 201. Then, an extended source region 214 and an extended drain region 215 are created by introducing atoms of a dopant material in regions of the substrate between the gate electrode 202 and the trench isolations 204, 205. This may be done by exposing the substrate 201 to an ion beam comprising ions of the desired dopant material, e.g., an N-type dopant or a P-type dopant depending on the particular application. In other embodiments of the present invention, the extended source region and the extended drain region may be formed by means of thermal diffusion.

Subsequently, a screening layer 203 covering sidewalls of the gate electrode 202 and portions of the substrate 201 adjacent the gate electrode 202 is formed, and then the spacers 206, 207 are formed.

The spacers 206, 207 have an angled shape similar to the shape of the letter "L." The spacer 206 comprises a first shank 216, which is substantially parallel to the surface of the substrate 201, and a second shank 217, being substantially parallel to a side surface of the gate electrode 202. Similarly, the spacer 207 comprises a first shank 218 substantially parallel to the surface of the substrate 201 and a second shank 219 substantially parallel to the side surface of the gate electrode 202.

The formation of the screening layer 203 and the spacers 206, 207 can be performed as follows. First, in some embodiments, the screening layer 203 is formed over the substrate 201, the sidewalls of the gate electrode 202 and the BARC layer 220. Then, a layer of the spacer material and a temporary layer are deposited. The temporary layer and the screening layer may substantially comprise the same material.

A first anisotropic etching process is performed which is adapted to selectively remove a material of the temporary layer. Due to the anisotropy of the etching process, disposable sidewall spacers similar to the sidewall spacers 110, 111 shown in FIG. 1 and comprising residues of the temporary layer are formed at side surfaces of the gate electrode 202. Subsequently, a second etching process which is adapted to selectively remove the spacer material is performed to remove the layer of spacer material with the exception of those portions that are protected by the sidewall spacers comprising residues of the temporary layer adjacent the gate electrode 202. Finally, a third etching process adapted to selectively remove the material of the temporary layer and the material of the screening layer is performed to remove the sidewall spacers comprising residues of the temporary layer and those portions of the screening layer which are not covered by the spacers 206, 207.

In a particular embodiment of the present invention, the material of the screening layer and the temporary layer comprises silicon dioxide, whereas the spacer material comprises silicon nitride.

Etching may be performed by means of dry etching processes known as plasma etching, or reactive ion etching, or ion enhanced etching. In dry etching, a radio frequency glow discharge produces a chemically reactive species such as atoms, radicals and ions from a relatively inert molecular gas. The etching gas is selected such that a generated species reacts chemically with the material to be etched, creating a volatile reaction product. The energy of ions impinging on the substrate may be controlled by varying the frequency applied in creating the glow discharge and/or applying a DC bias to the substrate. In general, the greater the energy of the ions, the more anisotropic or directional the etching process.

In an embodiment of the present invention, the screening layer and the temporary layer comprise silicon dioxide. Selective removal of these layers may be achieved by using an etching gas comprising $C_2F_6$ and $N_2$ or an etching gas comprising $C_4F_8$ and Ar. $C_2F_6$ and $C_4F_8$ provide a good selectivity with respect to oxide and nitride, whereas $N_2$ and Ar are nonselective diluting gases. The layer of spacer material may comprise silicon nitride. Selective dry etching of the spacer material may be performed by means of an etching gas comprising a mixture of $CHF_3$ and $O_2$, $CH_2$, $F_2$ and/or $CH_3F$ or a mixture of $CF_4$, $Cl_2$, HBr and/or $O_2$. The BARC layer 220 may comprise silicon oxynitride. In other embodiments of the present invention, wet chemical etching may be used instead of dry etching.

Figure 2B:
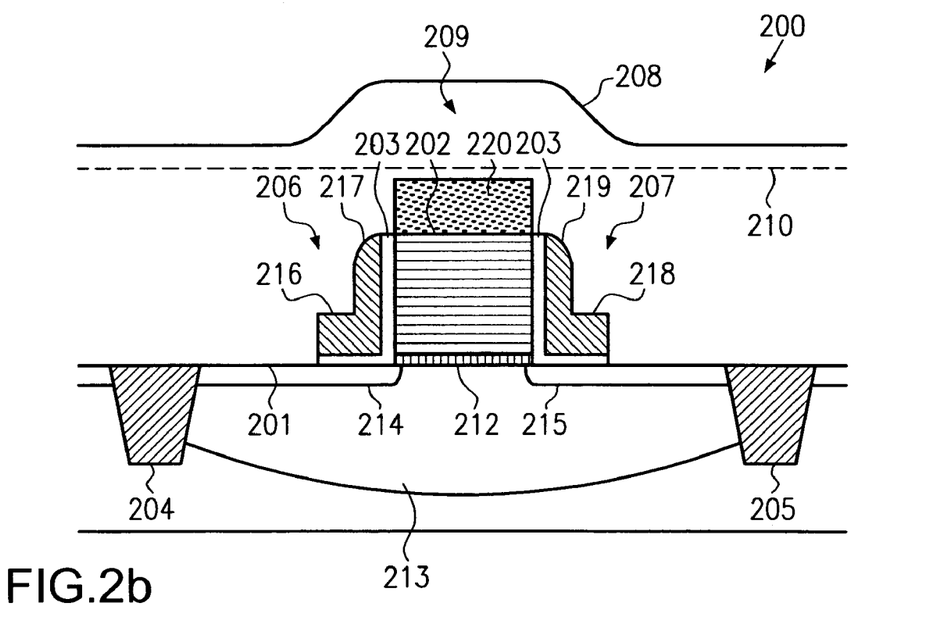

FIG. 2b shows a schematic cross-sectional view of the field effect transistor 200 in a later stage of the manufacturing process. A layer 208 of a material is deposited over the substrate 201. The layer 208 may comprise amorphous silicon, polycrystalline silicon or crystalline silicon.

A thickness of the layer 208 is greater than a height of the gate electrode 202 covered with the BARC layer 220. The shape of the layer 208 matches a topology of the surface of the substrate 201 and the gate electrode 202. Thus, the layer 208 comprises a bump above the gate electrode 202.

Subsequently, the layer 208 is planarized. This planarization may be performed by means of chemical mechanical polishing. In chemical mechanical polishing, the substrate 201 is moved relative to a polishing pad. Slurry is supplied to the polishing pad. The slurry comprises a chemical compound which reacts with the material of the layer 208. The reaction product is removed by abrasives that are present in the slurry and/or the polishing pad. Thereby, a portion 209 of the layer 208 above the dashed line 210 shown in FIG. 2b is removed. In particular, the removed portion 209 comprises the bump above the gate electrode 202. In other embodiments of the present invention, other known planarization techniques, such as sacrificial layer etchback, may be used for planarizing the layer 208.

After planarization, an etching process which, in particular embodiments, may be designed as an isotropic etching process is performed wherein the layer 208 is exposed to an etchant. The etchant is adapted such that the material of the layer 208 is selectively removed, whereas the materials of the BARC layer 220 and the spacers 206, 207 are only slightly affected by the etchant. The etching process can comprise dry etching. Selectivity of the etching process may be achieved by providing an etching gas selected to generate a reactive species that reacts strongly with the material of the layer 208, but only weakly with the spacer material and the material of the screening layer 202.

In embodiments of the present invention wherein the layer 208 comprises silicon, the BARC layer 220 comprises silicon oxynitride, and the spacer material comprises silicon nitride, an etching process having a high selectivity of the etching of silicon with respect to silicon nitride and silicon oxynitride is used. This may be done by using an etching gas comprising $CF_4$, $SF_6$, $Cl_2$, HBr and $O_2$. The etching may be performed at a low bias power and a high magnetic field in order to achieve low ion energies and, thus, a dominance of chemical etching over physical etching.

In the etching process, the surface of the layer 208 advances towards the surface of the substrate 208. Since the surface of the layer 208 is planar, the local thickness of the layer 208 remains substantially uniform, independent of whether the etching process is anisotropic or not. Thus, both isotropic and anisotropic etching processes may be used. Due to the substantially uniform thickness reduction of the layer 208, the layer surface remains substantially parallel to the surface of the substrate 201.

As soon as the thickness of the layer 208 becomes smaller than the height of the gate electrode 202 covered with the BARC layer 220, the gate electrode 202 appears on the surface of the layer 208. Due to the selectivity of the etching process, the BARC layer 220 and the spacers 206, 207 remain substantially unaffected by the etchant, thus protecting the gate electrode 202 from being etched. Therefore, the gate electrode 202 is gradually exposed, as the etching of the layer 208 continues and the thickness of the layer 208 is further reduced.

During etching, an emission intensity representative of a chemical reaction between the etchant and the spacer material is measured.

Excited molecules that are generated by the electric discharge in the etching gas or by chemical reactions between the reactive species and the material on the surface of the substrate emit light when electrons relax from a higher energy state into a lower energy state. A spectrum of the emitted light is characteristic of the composition of the plasma. The intensity of spectral lines in the spectrum is representative of the concentration of particular species of atoms, ions and molecules. A measurement of an emission intensity of at least one spectral line emitted by a product of the chemical reaction between the etchant and the spacer material yields a measure of the concentration of this product, which is representative of the rate at which the reaction occurs.

The measurement of the emission intensity can be performed by directing light emitted in the vicinity of the surface of the substrate 201 to a detector equipped with a filter that lets light having the wavelength of the spectral line emitted by the product of the chemical reaction between the etchant and the spacer material pass. Alternatively, the detector may be equipped with a monochromator configured to let the wavelength of the spectral line pass.

In embodiments of the present invention wherein the spacer material comprises silicon nitride, the measurement of the emission intensity representative of a chemical reaction between the spacer material and the etchant may comprise a measuring of the intensity of a spectral line of N having a wavelength of 674 nm and/or a measuring of the intensity of a spectral line of CN having a wavelength of 387 nm.

In the initial phase, the measured emission intensity is low since the whole substrate 201 is covered by the layer 208, which protects the spacers 206, 207 from chemical reactions with the etchant. As etching advances, the tops of the first shanks 217, 219 of the sidewall spacers 206, 207 are exposed. This leads to an increase of the measured emission intensity, since the spacer material reacts with the etchant, although significantly less intensive as the layer 208. The emission intensity increases slowly as the etching process advances and greater portions of the first shanks 217, 219 are exposed. As soon as the second shanks 216, 218 of the spacers 206, 207 are exposed, a further increase of the emission intensity may be observed since the surface layer 208 remains substantially parallel to the substrate surface as it advances towards the substrate, such that the exposing of the second shanks 216, 218 typically occurs very quickly.

The exposing of the second shanks is detected. This is done by detecting the increase of the measured emission intensity. Based on the detection, the exposing of the layer 208 to the etchant may then be stopped.

The detection of the increase of the emission intensity can be performed by comparing the measured emission intensity with a first threshold value. The etching process may then be stopped, for example as soon as the emission intensity exceeds the first threshold value.

In another embodiment of the present invention, the detection of the increase of the emission intensity is performed by calculating a gradient of the measured emission intensity and comparing the gradient with a second threshold value. The etching process may be stopped as soon as the gradient of the emission intensity exceeds the second threshold value. Advantageously, detecting the increase based on the gradient of the emission intensity may allow a more precise detection of the exposure of the second shanks, since the rapid increase of the emission intensity upon the exposing of the second shanks 216, 218 may entail moderately high values of the gradient.

The first and the second threshold value may be determined by performing a series of experiments. In each experiment, a field effect transistor similar to the field effect transistor 200 shown in FIG. 2b or another suitable test structure is fabricated. After planarization, the field effect transistor is exposed to the etchant. The etching process is stopped after a predetermined etching time. In the individual experiments, different etching times are used. During etching, the emission intensity and/or the gradient of the emission intensity are recorded. Subsequently, the field effect transistors are investigated, e.g., by means of microscopy, to determine whether the second shanks 216, 218 of the spacers 206, 207 are exposed. The emission intensities and/or gradients determined immediately prior to the stopping of the etching process are then related to the results of the microscopic investigation to establish typical values of the emission intensity and/or the gradient thereof at the exposing of the second shanks. These values may be used as the first and the second threshold value, respectively.

Figure 2C:
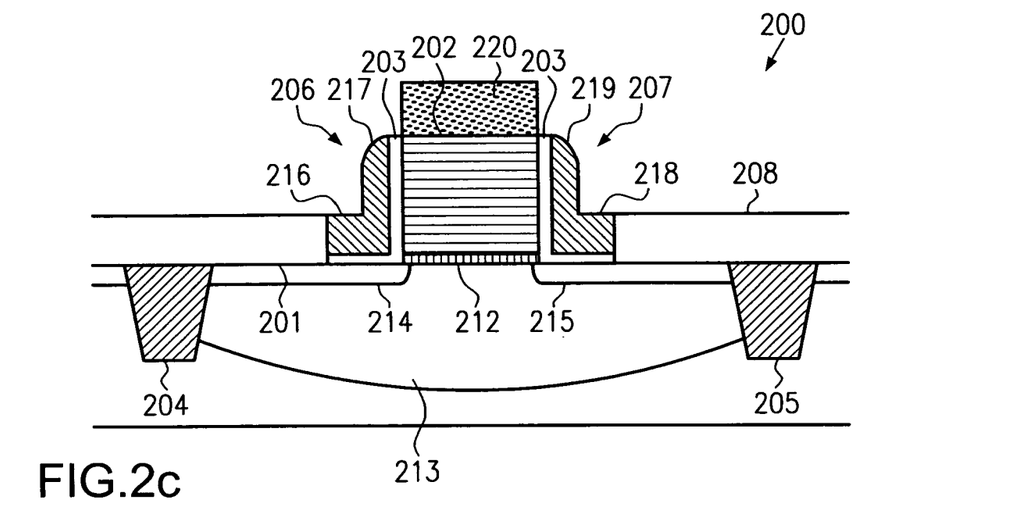

FIG. 2c shows a schematic cross-sectional view of the field effect transistor 200 after the stopping of the etching process. Since the etching process has been stopped upon the detecting of the exposure of the second shanks 216, 218, the thickness of the layer 208 substantially equals the total thickness of the gate insulation layer 212, the screening layer 203 and the second shanks 216, 218 of the spacers 206, 207.

Subsequently, the layer 208 is removed from the trench isolations 204, 205 to avoid electric shorts between the field effect transistor 200 and adjacent circuit elements. This can be done by means of photolithographic techniques known to persons skilled in the art.

Figure 2D:
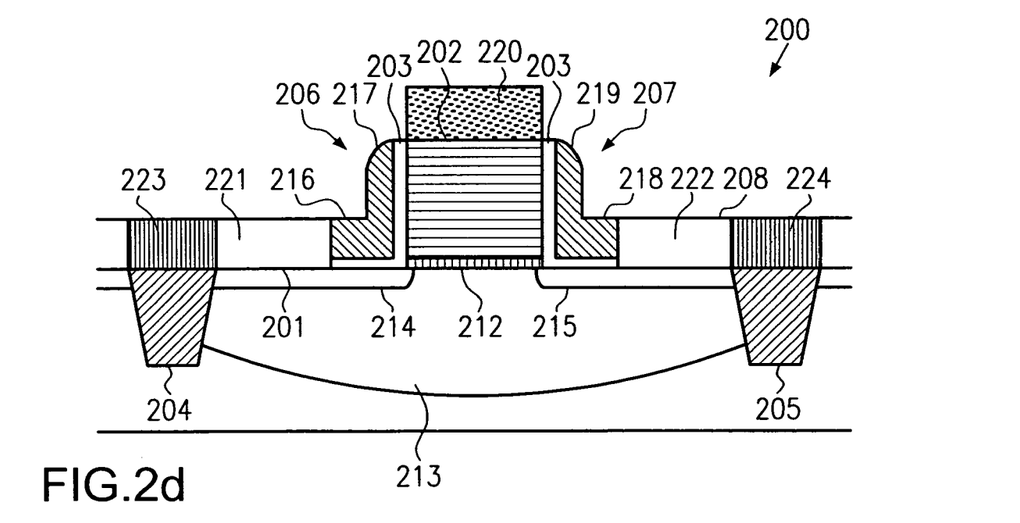

In some embodiments of the present invention which are described with reference to FIG. 2d, the deposition of the layer 208 is adapted such that the material is crystalline in portions 221, 222 above the extended source region 214 and the extended drain region 215, whereas the material in portions 223, 224 of the layer 208 above the trench isolations 204, 205 adopts an amorphous structure. In this deposition, the influence of the underlying material on the ordering of the particles in the layer 208 is utilized. In the portions 221, 222, the ordering of the particles is influenced by the crystalline structure of the substrate material. Since this ordering influence is missing in the portions 223, 224, the particles in the portions 223, 224 arrange themselves in an amorphous structure.

In particular embodiments of the present invention, this effect may be used to selectively remove the layer 208 from trench isolations 204, 205. The layer 208 is exposed to an etchant configured to etch the amorphous material at a higher etching rate than the crystalline material. The etching process is performed during a time interval sufficient to remove the amorphous material in the portions 223, 224 from the trench isolations. Due to the slower etching rate of the crystalline material, parts of the portions 221, 222 above the extended source region 214 and the extended drain region 215 remain on the substrate 201. The material loss in the portions 221, 222 of the layer 208 may be taken into account in advance by correspondingly adapting the thickness of the shanks 216, 218.

In embodiments wherein the layer 208 comprises silicon, the etchant configured to etch the amorphous material at a higher etching rate than the crystalline material may comprise $CF_4$, $SF_6$, $Cl_2$, HBr and/or $O_2$.

Finally, the field effect transistor 200 is completed by implanting dopant ions into the layer 208 and annealing the field effect transistor 200 to form a raised source region and a raised drain region similar to the raised source region 107 and the raised drain region 108 of the field effect transistor 100 shown in FIG. 1.

Figure 3A:
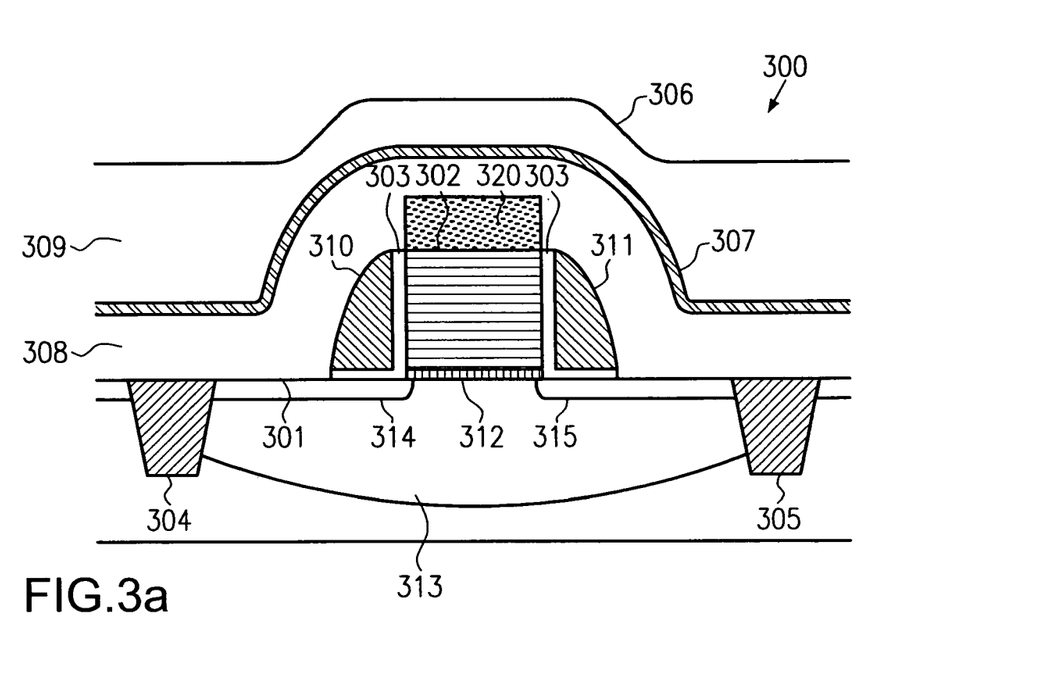
FIGS. 3a-3c show schematic cross-sectional views of a field effect transistor in stages of a manufacturing process according to another embodiment of the present invention.

A further embodiment of the present invention is described with reference to FIGS. 3a-3c. FIG. 3a shows a schematic cross-sectional view of a field effect transistor 300 in a first stage of the manufacturing process.

In a substrate 301, an active region 313 and trench isolations 304, 305 are formed. A gate insulation layer 312 and a gate electrode 302 covered with a BARC layer 320 are created over the substrate 301. Subsequently, an extended source region 314 and an extended drain region 315 are formed in regions between the gate electrode 312 and trench isolations 304, 305 by introducing ions of a dopant material. A screening layer 303 and sidewall spacers 310, 311 are formed adjacent the gate electrode 302.

A layer 306 of a material is deposited over the substrate 301. The layer 306 comprises a sub-layer 307, which comprises an etch indicator material in addition to the material of the layer 306. The deposition of the layer 306 can be performed using known techniques such as physical vapor deposition, chemical vapor deposition and plasma enhanced chemical vapor deposition. A first sub-layer 308 comprising the material of the layer 306 is deposited. No etch indicator material or only very small amounts of etch indicator material are present in the first sub-layer 308. Then, the sub-layer 307 additionally comprising the etch indicator material is deposited as a second sub-layer on the first sub-layer 308. A third sub-layer 309 comprising the material of the layer 306, but only very small amounts of the etch indicator material or no etch indicator material at all, is then deposited on the sub-layer 307. The individual sub-layers 307, 308, 309 of the layer 306 are deposited conformally.

In one embodiment of the present invention, the first sub-layer 308 and the third sub-layer 309 comprise less than $10^{20}$ atoms/cm$^3$ of the etch indicator material. In other embodiments, the first sub-layer 308 and the third sub-layer 309 may comprise less than $10^{18}$ atoms/cm$^3$ of the indicator material. A thickness of the first sub-layer 308 may be in the range of 10-100 nm. A thickness of the sub-layer 307 may be in the range of 5-50 nm. A thickness of the third sub-layer may be in the range of 50-300 nm.

The material of the layer 306 may comprise silicon. The etch indicator material may comprise germanium.

A form of the sub-layer 307 matches a topography of the substrate 301 and the gate electrode 302, the screening layer 306 and the sidewall spacers 310, 311. Thus, the sub-layer 307 comprises a bump above the gate electrode 302. Inclined portions of the sub-layer 307 are adjacent the gate electrode 302. At a distance to the gate electrode 302, the sub-layer 307 is substantially horizontal.

A surface of the layer 306 also matches the topography of the substrate 301. Therefore, the surface of the layer 306 also comprises a bump above the gate electrode 312.

Figure 3B:
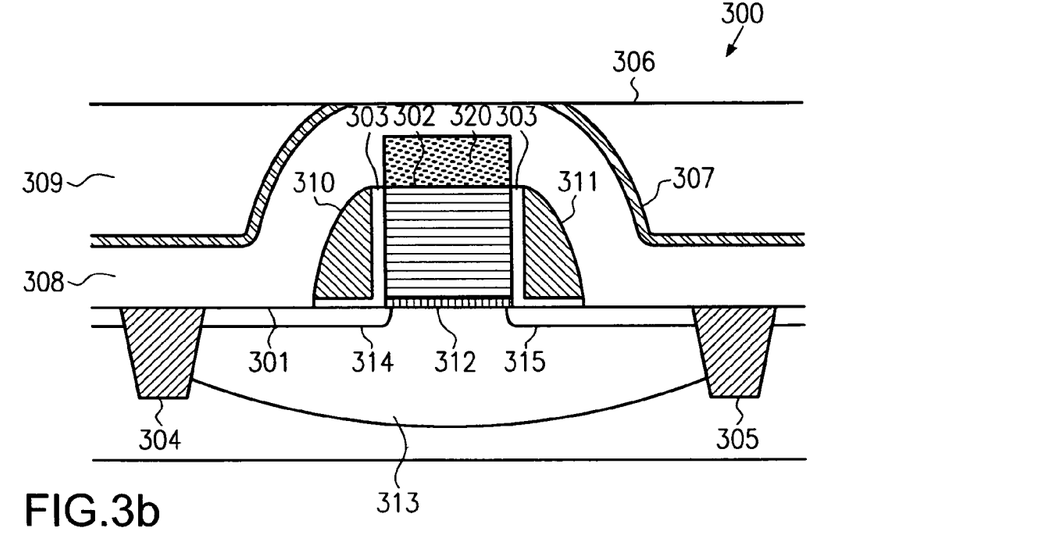

FIG. 3b shows the field effect transistor 300 in a later stage of the manufacturing process. The layer 306 is planarized, which may be done using planarization techniques such as chemical mechanical polishing or sacrificial layer etchback, as described above.

In the planarization, the bump of the layer 306 is removed. Additionally, a portion of the sub-layer 307 above the gate electrode is removed. The inclined portions of the sub-layer 307 extend to the surface of the layer 306.

After planarization, the layer 306 is exposed to an etchant adapted to selectively remove the material of the layer 306, whereas the materials of the BARC layer 320 and the sidewall spacers 310, 311 are substantially not affected by the etchant. An etching rate of the sub-layer 307 is substantially equal to an etching rate of the first sub-layer 308 of the layer 306. Therefore, the surface of the layer 306 remains substantially parallel to a surface of the substrate 301 as it advances towards the substrate 301 in the etching process.

During etching, an emission intensity representative of a chemical reaction between the etch indicator material and the etchant is measured. This may be done by measuring an emission intensity of at least one spectral line emitted by a product of the chemical reaction between the etchant and the etch indicator material, similar to the measurement of the emission intensity representative of the chemical reaction between the spacer material and the etchant in the embodiment described with reference to FIGS. 2a-2d. The emission intensity is a measure for the concentration of the product, which is representative of the rate at which the chemical reaction occurs.

In an embodiment of the present invention wherein the material of the layer 306 comprises silicon and the etch indicator material comprises germanium, the measurement of the emission intensity may comprise measuring the intensity of a spectral line of $SiF_4$ having a wavelength of 265.1 nm, 271.0 nm, 275.5 nm or 303.9 nm.

In the initial phase of the etching process, a small emission intensity is measured since only the etch indicator material in the inclined portions of the sub-layer 307 reacts with the etchant. As the surface of the layer 306 advances towards the substrate 301, the emission intensity remains small until the surface of the layer 306 reaches the horizontal portions of the sub-layer 307. Then, the etch indicator material in the horizontal portions of the sub-layer 307 reacts with the etchant, which leads to an increase of the measured emission intensity.

The exposing of the layer 306 to the etchant may be stopped based on the detecting of the increase of the emission intensity. The detecting of the increase of the emission intensity can be performed by comparing the measured emission intensity with a third threshold value. For example, the etching process may be stopped as soon as the emission intensity exceeds the third threshold value.

In other embodiments of the present invention, the increase of the emission intensity can be detected by comparing a gradient of the measured emission intensity with a fourth threshold value. For instance, the etching process may be stopped as soon as the gradient of the emission intensity exceeds the fourth threshold value. Advantageously, detecting the increase of the emission intensity based on its gradient may allow a more precise detection of the rapid increase of the emission intensity corresponding to the exposure of the horizontal portions of the sub-layer 307.

In further embodiments of the present invention, a decrease of the emission intensity may be detected instead of an increase. If the etching process is continued after the exposure of the horizontal portions of the sub-layer 307, the measured emission intensity decreases to a very small value, since the sub-layer 307 is completely removed.

The decrease in the emission intensity can be detected by comparing the emission intensity with a fifth threshold value, which is smaller than the maximum value of the emission intensity that occurs during the etching of the horizontal portions of the sub-layer 307. The etching process may then be stopped as soon as the emission intensity falls below the fifth threshold value.

Alternatively, the decrease in the emission intensity may be detected by comparing the gradient of the emission intensity with a sixth threshold value that is smaller than zero. The etching process may be stopped as soon as the emission intensity falls below the sixth threshold value.

Advantageously, stopping the etching process upon the detection of a decrease in the emission intensity allows a substantial removal of the sub-layer 307 such that potential adverse effects caused by the presence of the etch indicator material are minimized.

Values of the third to sixth threshold values may be determined by performing a series of experiments. In each experiment, a field effect transistor similar to the field effect transistor 300 shown in FIG. 3b or another suitable test structure is formed. Then, the field effect transistors are exposed to an etchant adapted to selectively remove the layer material. The etching process is stopped after a predetermined etching time. Different etching times are used in the individual experiments. After etching, the field effect transistors are investigated, for instance by means of microscopy, to determine the thickness of the material layer remaining on the field effect transistors and to determine whether the sub-layers comprising the etch indicator material are exposed. The results of the investigation of the field effect transistors are related to emission intensities and/or gradients of emission intensities measured immediately prior to the stopping of the etching processes to establish typical values of the emission intensity and the gradient thereof occurring during the etching of the horizontal portions of the sub-layers comprising the etch indicator material, which may be used as threshold values.

Figure 3C:
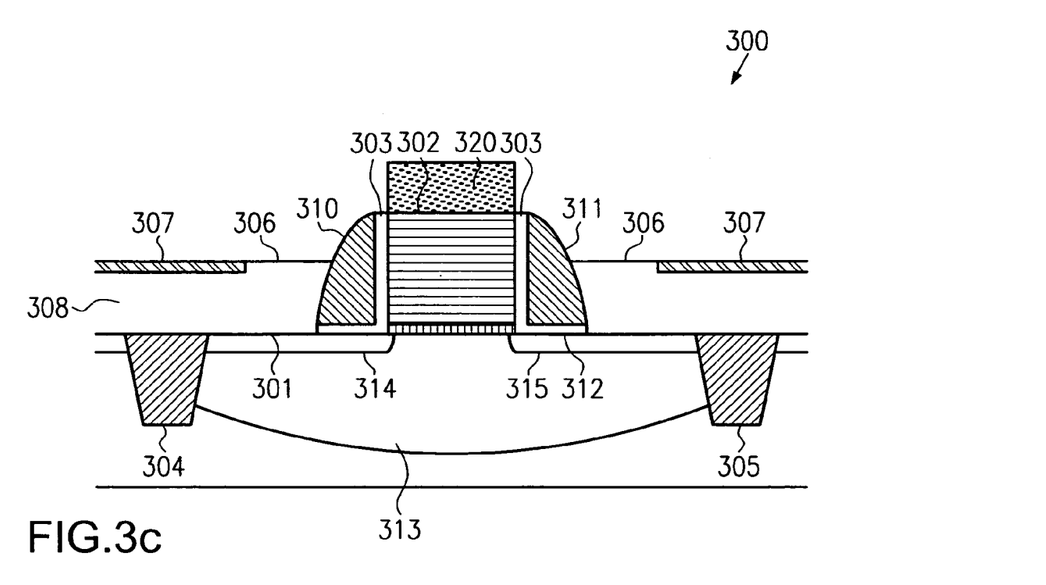

FIG. 3c shows the field effect transistor 300 after the stopping of the etching process. Portions of the layer 306 remain on the surface of the substrate 301 adjacent the gate electrode 302. In some embodiments, remainders of the sub-layer 307 may still be present on the surface of the layer 306. A thickness of the layer 306 substantially equals a thickness of the first sub-layer 308 of the layer 306.

Subsequently, portions of the layer 306 above the trench isolations 304, 305 are removed. Similar to the embodiment described with reference to FIGS. 2a-2d, this may be done by means of photolithography or by means of exposing the layer 306 to an etchant which etches amorphous layer material at a higher rate than crystalline layer material. The field effect transistor 300 is completed by implanting ions of a dopant into the layer 306 and annealing the field effect transistor 300 to form a raised source region and a raised drain region.

It is not necessary for the present invention to provide the sub-layer comprising the etch indicator material as a second sub-layer between a first and a third sub-layer comprising no etch indicator material at all or only small amounts of the etch indicator material.

In other embodiments of the present invention, in the deposition of a layer of the material on the substrate, a first sub-layer comprising no etch indicator material at all or only small amounts of the etch indicator material is deposited over the substrate. In one embodiment of the present invention, the first sub-layer comprises less than $10^{20}$ atoms/cm$^3$ of the etch indicator material. In other embodiments of the present invention, the first sub-layer may comprise less than $10^{18}$ atoms/cm$^3$ of the etch indicator material. Then, a comparatively thick second sub-layer additionally comprising the etch indicator material is deposited. The first sub-layer may have a thickness in the range of 10-100 nm. The second sub-layer may have a thickness in the range of 50-300 nm. Subsequently, the layer is planarized and exposed to an etchant adapted to selectively remove the layer material. An emission intensity representative of a chemical reaction between the etch indicator material and the etchant is measured. As long as the second sub-layer is etched, large values of the emission intensity are measured. The emission intensity decreases as soon as the second sub-layer is completely removed. The etching process is stopped upon a detection of the decrease in the emission intensity.

In further embodiments of the present invention, the thickness of the layer of material is measured. This may be done by means of interferometrical techniques. Light having a wavelength at which the layer is transparent is directed to the layer. A first portion of the light is reflected at the surface of the layer. A second portion of the light is reflected at the boundary between the layer and the substrate. The first and the second portion interfere with each other. During the etching of the layer, the thickness of the layer decreases, such that a phase difference between the first and the second portion varies. This leads to sinusoidal variations of the intensity of the reflected light. Thus, the thickness of the removed portion of the layer may be measured in terms of the wavelength of the light. The etching process is stopped as soon as the thickness of the removed portion is equal to or greater than a predetermined value.

The present invention is not restricted to the formation of field effect transistors comprising a raised source region and a raised drain region. Instead, the present invention may be applied quite generally to the formation of layers of a material adjacent a feature on a substrate. For example, the present invention may be applied to the formation of contact areas.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a substrate comprising a feature;
   forming at least one spacer comprising a spacer material adjacent said feature, said at least one spacer having an angled shape, a first shank of said at least one spacer being substantially parallel to a surface of said substrate, a second shank of said at least one spacer being substantially parallel to a side surface of said feature;
   depositing a layer of a material over said substrate and said feature;
   planarizing said layer of material;
   exposing said layer of material to an etchant, said etchant being adapted to selectively remove said layer of material;
   detecting when said etching process exposes said first shank; and
   stopping the exposure of the layer of material to the etchant upon detecting the exposure of the first shank.

2. The method of claim 1, wherein a thickness of said deposited layer is greater than a height of said feature.

3. The method of claim 1, further comprising forming a screening layer at least partially covering said feature and a portion of said substrate adjacent said feature, said at least one spacer being formed over said screening layer.

4. The method of claim 1, further comprising:
   measuring an emission intensity representative of a chemical reaction between said etchant and said spacer material; and
   wherein said detecting the exposing of the first shank comprises detecting an alteration of said emission intensity.

5. The method of claim 1, wherein said side surface of said feature is substantially perpendicular to said surface of said substrate.

6. The method of claim 1, wherein said feature comprises a gate electrode.

7. The method of claim 1, further comprising forming a screening layer at least partially covering said feature.

8. The method of claim 1, further comprising selectively removing said layer of material from a trench isolation.

9. The method of claim 8, wherein said selectively removing said layer of material from a trench isolation comprises exposing said layer of material to a second etchant, said second etchant being adapted to etch said material in an amorphous state at a higher rate than said material in a crystalline state.

10. The method of claim 1, wherein said layer of material comprises polysilicon.

11. The method of claim 1, further comprising implanting at least one dopant ion in a remaining portion of said layer of material.

* * * * *